US010930580B2

(12) United States Patent
Hu et al.

(10) Patent No.: US 10,930,580 B2
(45) Date of Patent: Feb. 23, 2021

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Chih-Chia Hu, Taipei (TW); Sen-Bor Jan, Tainan (TW); Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/725,732

(22) Filed: Dec. 23, 2019

(65) Prior Publication Data

US 2020/0144160 A1    May 7, 2020

Related U.S. Application Data

(62) Division of application No. 16/122,318, filed on Sep. 5, 2018, now Pat. No. 10,515,874.

(Continued)

(51) Int. Cl.
*H01L 23/48* (2006.01)
*H01L 23/00* (2006.01)
(Continued)

(52) U.S. Cl.
CPC ...... *H01L 23/481* (2013.01); *H01L 21/76805* (2013.01); *H01L 22/32* (2013.01); *H01L 23/528* (2013.01); *H01L 24/03* (2013.01); *H01L 24/05* (2013.01); *H01L 24/06* (2013.01); *H01L 24/09* (2013.01); *H01L 24/80* (2013.01); *H01L 24/08* (2013.01); *H01L 2224/03* (2013.01); *H01L 2224/03462* (2013.01); *H01L 2224/03464* (2013.01); *H01L 2224/05124* (2013.01); *H01L 2224/05147* (2013.01); *H01L 2224/05166* (2013.01); *H01L 2224/05181* (2013.01); *H01L 2224/05186* (2013.01); *H01L 2224/05647* (2013.01); *H01L 2224/0603* (2013.01);

(Continued)

(58) Field of Classification Search
CPC .................................................... H01L 23/481
See application file for complete search history.

(56) References Cited

U.S. PATENT DOCUMENTS 7,081,404 B2   7/2006   Jan et al.
7,977,232 B2   7/2011   Eto
(Continued)

*Primary Examiner* — William A Harriston
(74) *Attorney, Agent, or Firm* — Slater Matsil, LLP

(57) ABSTRACT

A semiconductor device including a test pad contact and a method of manufacturing the semiconductor device are disclosed. In an embodiment, a semiconductor device may include a first metal feature and a second metal feature disposed in a single top metal layer over a substrate. A test pad may be formed over and electrically connected to the first metal feature. A first passivation layer may be formed over the second metal feature and the test pad and may cover top and side surfaces of the test pad. A first via may be formed penetrating the first passivation layer and contacting the test pad and a second via may be formed penetrating the first passivation layer and contacting the second metal feature.

20 Claims, 14 Drawing Sheets

Related U.S. Application Data

(60) Provisional application No. 62/592,539, filed on Nov. 30, 2017.

(51) Int. Cl.
  *H01L 23/528* (2006.01)
  *H01L 21/768* (2006.01)
  *H01L 21/66* (2006.01)

(52) U.S. Cl.
  CPC ............... *H01L 2224/08146* (2013.01); *H01L 2224/08235* (2013.01); *H01L 2224/80447* (2013.01); *H01L 2225/06513* (2013.01); *H01L 2225/06524* (2013.01); *H01L 2225/06596* (2013.01); *H01L 2924/14* (2013.01)

(56) References Cited

U.S. PATENT DOCUMENTS

| | | |
|---|---|---|
| 8,440,272 B2 | 5/2013 | Lin et al. |
| 8,853,694 B2 | 10/2014 | Han et al. |
| 8,986,523 B2 | 3/2015 | Ackerson et al. |
| 2002/0050629 A1 | 5/2002 | Seshan et al. |
| 2005/0194692 A1 | 9/2005 | Windlass et al. |
| 2008/0185724 A1* | 8/2008 | Tseng ................ H01L 23/53223 257/762 |
| 2013/0105981 A1 | 5/2013 | Cooney, III et al. |
| 2013/0241049 A1 | 9/2013 | Yu et al. |
| 2015/0228547 A1 | 8/2015 | Shih |
| 2017/0186715 A1 | 6/2017 | Yu et al. |
| 2017/0229358 A1 | 8/2017 | Cooney, III et al. |
| 2017/0316991 A1 | 11/2017 | Beckmeier et al. |

\* cited by examiner

SEMICONDUCTOR DEVICE AND METHOD OF MANUFACTURE

CROSS-REFERENCE TO RELATED APPLICATIONS

This application is a divisional of U.S. patent application Ser. No. 16/122,318, filed Sep. 5, 2018, and entitled "Semiconductor Device and Method of Manufacture," which claims the benefit of U.S. Provisional Application No. 62/592,539, filed on Nov. 30, 2017, entitled "Semiconductor Device and Method of Manufacture," which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
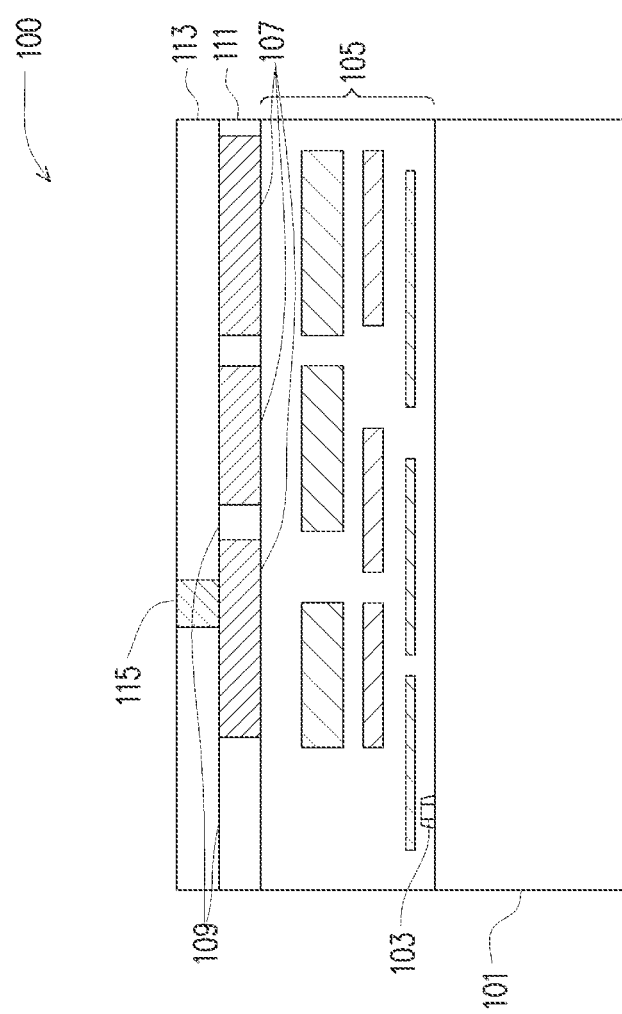
FIGS. 1-10 illustrate cross-sectional views of intermediate processing steps in forming a semiconductor die according to an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a side view of a die 100, which includes a substrate 101. The substrate 101 may be a bulk silicon substrate although other semiconductor materials including group III, group IV, and group V elements may also be used. Active devices 103, such as transistors, may be formed in and/or on the substrate 101.

An interconnect structure 105 is formed over the substrate 101. In some embodiments, the interconnect structure 105 may include at least one dielectric layer formed of low-k dielectric materials having k values, for example, lower than about 4.0. In some embodiments, the dielectric layers of the interconnect structure 105 may be made of, for example, silicon oxide, SiCOH, and the like. The interconnect structure 105 may further include metal lines and vias (i.e., connections), which are formed in the dielectric layers. For example, the interconnect structure 105 may include a plurality of metal layers that are interconnected through vias. The metal lines and vias may be formed of copper or copper alloys, and they can also be formed of other metals. The metal lines and vias may be formed by etching openings in the dielectric layers, filling the openings with a conductive material, and performing a planarization (such as CMP) to level top surfaces of the metal lines and vias with top surfaces of the dielectric layers.

A top metal layer 111 is formed over the interconnect structure 105. The top metal layer 111 includes a dielectric layer 109 and conductive features 107. The top metal layer 111 is formed by depositing the dielectric layer 109 over the top surface of the interconnect structure 105. The dielectric layer 109 may be deposited by chemical vapor deposition (CVD), physical vapor deposition (PVD), or the like. The dielectric layer may comprise the same material as the dielectric layers of the interconnect structure 105. For example, in some embodiments, the dielectric layer 109 may be made of silicon oxide, SiCOH, and the like.

The dielectric layer 109 may then be etched to form openings exposing the top surface of the interconnect structure 105. The conductive features 107 may be deposited in the openings by, for example, a plating process. The conductive features 107 may then be planarized by a process such as chemical mechanical polishing (CMP). The conductive features 107 may be made of copper or copper alloy. Other materials, such as aluminum, aluminum alloy, or the like may also be used to form the conductive features 107. As shown in FIG. 1, the conductive features 107 may be discrete features. For example, the conductive features 107 may be separated and electrically isolated from each other by the dielectric layer 109. According to other embodiments, the conductive features 107 may be portions of a continuous metallic feature.

A passivation layer 113 is formed over the top metal layer 111. In an embodiment, the passivation layer 113 may be polybenzoxazole (PBO), although any suitable material, such as benzocyclobutene (BCB), polyimide, or a polyimide derivative, may alternatively be utilized. The passivation layer 113 may be placed using, e.g., a spin-coating process, although any suitable method may alternatively be used.

A redistribution via 115 may be formed in the passivation layer 113. For example, the passivation layer 113 may be patterned to form an opening through which one of the conductive features 107 is exposed. The patterning of the passivation layer 113 may be performed using photolithography techniques. The redistribution via 115 may then be formed in the opening in the passivation layer 113. The redistribution via 115 may be made of aluminum, aluminum alloy, copper, or copper alloy, although other metallic materials may be used.

Figure 2:
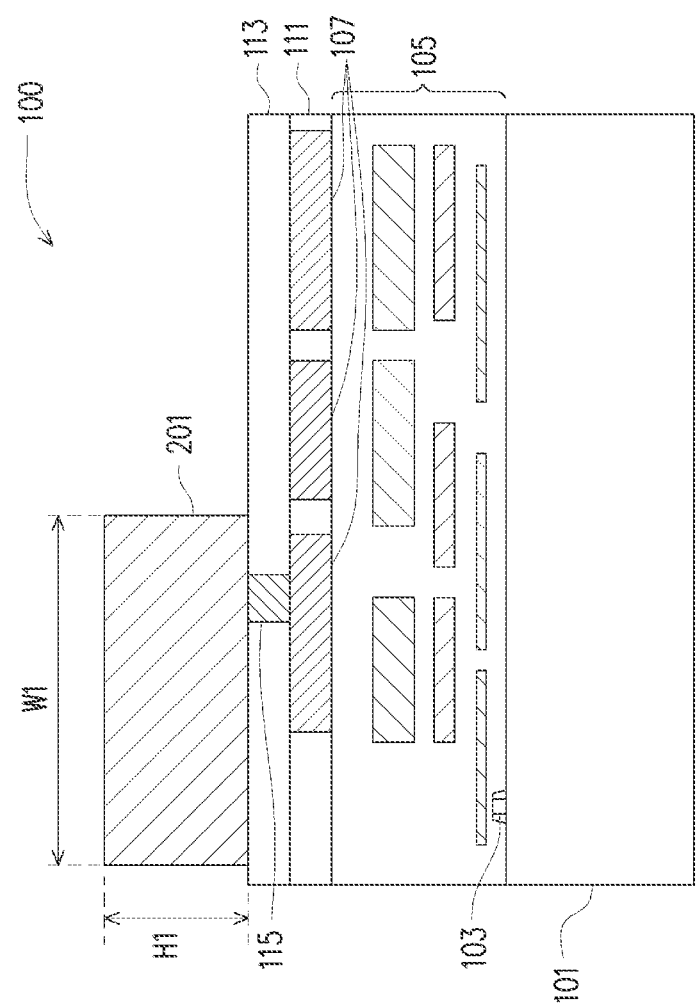

FIG. 2 illustrates the formation of a test pad 201. The test pad 201 is formed over and contacting the redistribution via 115. The test pad 201 is electrically coupled to the active devices 103 through conductive features such as metal lines and vias formed in the interconnect structure 105, the conductive features 107, and the redistribution via 115. The test pad 201 may be formed of aluminum or aluminum alloy, although other metallic materials may be used. The test pad 201 may be formed by blanket deposition. For example, CVD, PVD, or the like may be used to deposit a layer of aluminum over the surface of the passivation layer 113 and the redistribution via 115. A photoresist layer (not separately illustrated) may then be formed over the aluminum layer and the aluminum layer may be etched to form the test pad 201. In some embodiments, the test pad 201 may have a height H1 of between about 1,500 Å and about 28,000 Å, such as about 28,000 Å. In various embodiments, the test pad 201 may have a width W1 of between about 1.8 μm and about 31.5 μm, such as about 2 μm. The test pad 201 may have a length (not separately illustrated) of between about 20 μm and about 100 μm, such as about 50 μm. Furthermore, in some embodiments, the test pad 201 may be located in a corner or edge region of a completed semiconductor device. In other embodiments, the test pad 201 may be placed in a central region of the completed semiconductor device.

According to at least one embodiment, the test pad 201 and the redistribution via 115 may be formed simultaneously. For example, the passivation layer 113 may be formed over the top metal layer 111 and patterned to expose one of the conductive features 107. The test pad 201 and the redistribution via 115 may be formed by blanket deposition. For example, CVD, PVD, or the like may be used to deposit a layer of aluminum over the surface of the passivation layer 113, in the opening formed in the passivation layer 113, and over the exposed conductive feature 107. A photoresist layer (not separately illustrated) may then be formed over the aluminum layer and the aluminum layer may be etched to form the test pad 201.

Figure 3:
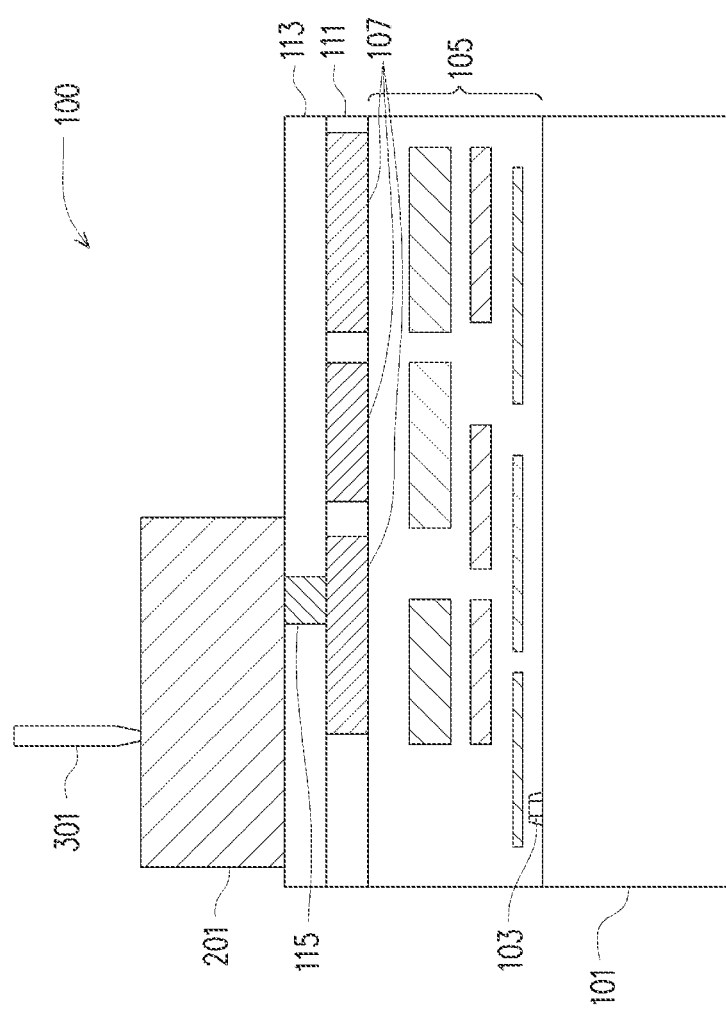

FIG. 3 illustrates a probing step, which may be part of a wafer-acceptance-test or a circuit test. The probing is performed to verify the functionality of the active devices 103 and the respective electrical connections (e.g., connections in the interconnect structure 105, conductive features 107, and redistribution via 115). The probing may be performed by contacting a probe needle 301 to the test pad 201. The probe needle 301 may be a part of a probe card having a plurality of probe needles, for example, which is connected to testing equipment (not separately illustrated). If the die 100 passes the wafer-acceptance-test, the die is a known good die (KGD).

Figure 4:
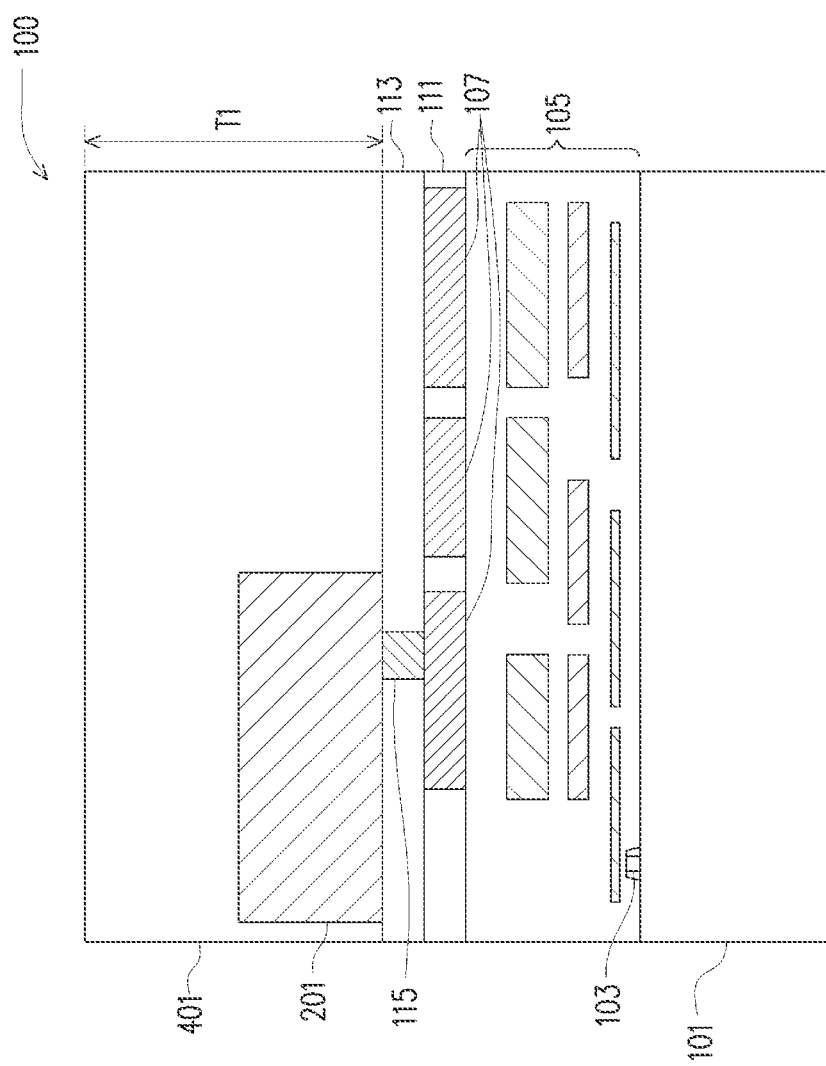

FIG. 4 illustrates the formation of a bond layer 401. The bond layer 401 is deposited over the top surface of the passivation layer 113 and over top and side surfaces of the test pad 201. The bond layer 401 may be used for fusion bonding (also referred to as oxide-to-oxide bonding). In accordance with some embodiments, the bond layer 401 is formed of a silicon-containing dielectric material such as silicon oxide, silicon nitride, or the like. The bond layer 401 may be deposited using any suitable method, such as, CVD, high-density plasma chemical vapor deposition (HDPCVD), PVD, atomic layer deposition (ALD), or the like. The bond layer 401 may be planarized, for example, in a chemical mechanical polish (CMP) process. The bond layer 401 may have a thickness T1 of between about 0.65 μm and about 6 μm, such as about 5.5 μm. The top surface of the bond layer 401 is higher than the top surface of the test pad 201. The bond layer 401 may be referred to as a passivation layer or a dielectric layer.

Figure 5:
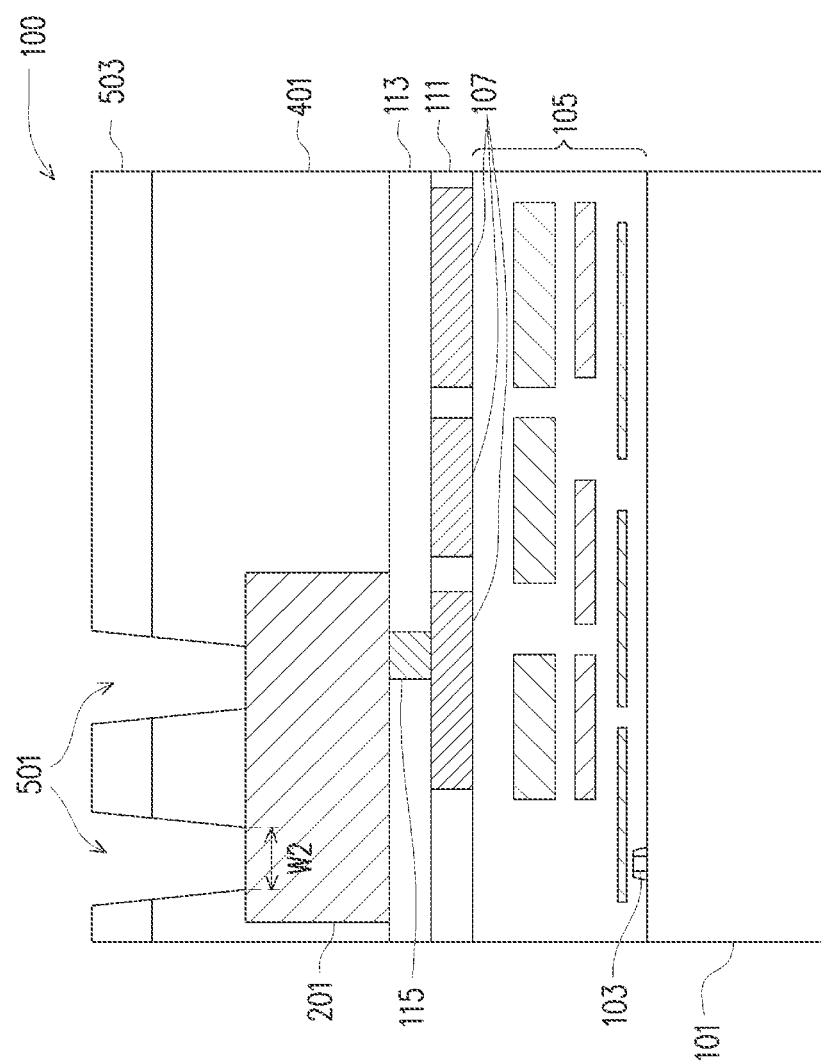

FIG. 5 illustrates the formation of first openings 501 in the bond layer 401 to expose the test pad 201. A first photoresist 503 is applied over the top surface of the bond layer 401 and patterned. The first photoresist 503 is then used to etch the bond layer 401 in order to form the first openings 501. The bond layer 401 may be etched by dry etching (e.g., reactive ion etching (RIE) or neutral beam etching (NBE)), wet etching, or the like. In accordance with some embodiments of the present disclosure, the etching stops on the test pad 201 such that the test pad 201 is exposed through the first openings 501 in the bond layer 401. The first openings 501 may have a width W2 of between about 1.2 μm and about 2 μm, such as about 1.4 μm.

Figure 6:
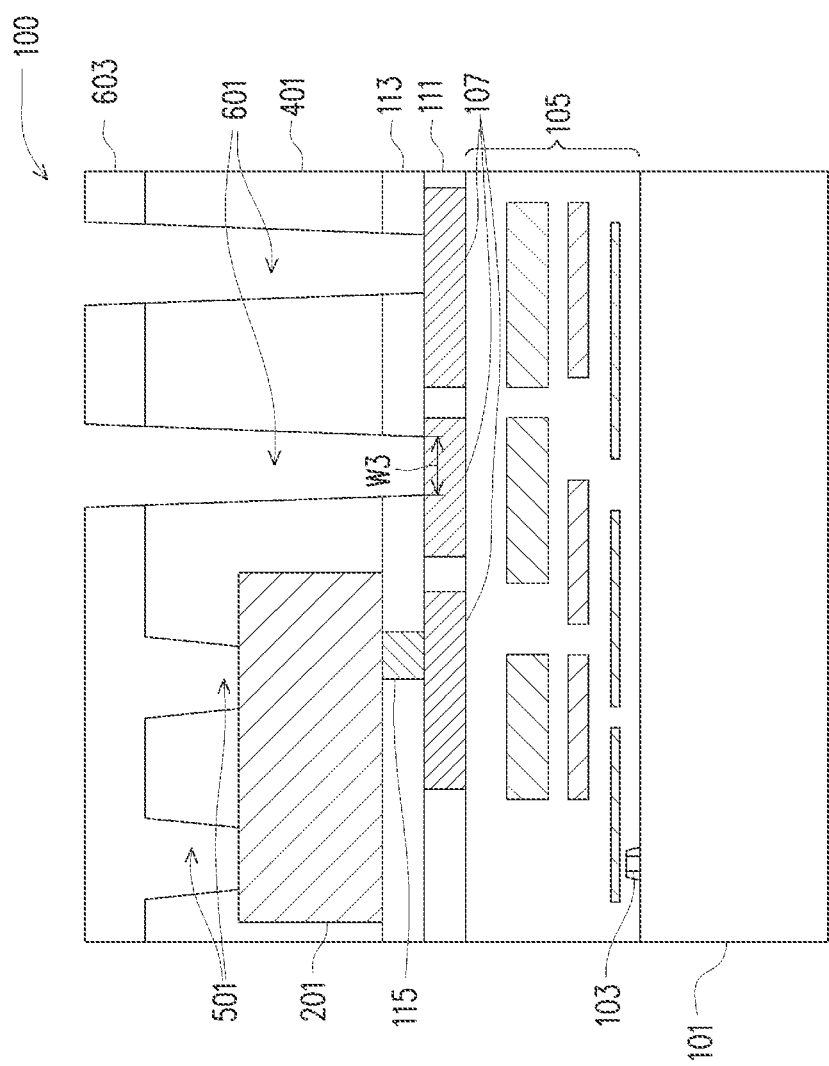

FIG. 6 illustrates the formation of second openings 601 in the bond layer 401 and the passivation layer 113 to expose the conductive features 107. A second photoresist 603 is applied over top surfaces of the bond layer 401 and the test pad 201 and in the openings 501 and the second photoresist 603 is patterned. The second photoresist 603 is then used along with one or more etches to etch the bond layer 401 and the passivation layer 113 in order to form the second openings 601. The etches used to form the second openings 601 may be the same or different from the etches used to form the first openings 501 and may include dry etching (e.g., RIE or NBE), wet etching, or the like. In accordance with some embodiments of the present disclosure, the etching stops on the conductive features 107 such that the conductive features 107 are exposed through the second openings 601 in the bond layer 401 and the passivation layer 113. The second openings 601 may have a width W3 of between about 1.2 μm and about 2 μm, such as about 1.4 μm. According to various embodiments, the width W3 may be the same or different than the width W2. A ratio of the width W2 to the width W3 may be between about 1.2 and about 0.8, such as about 1.

Figure 7:
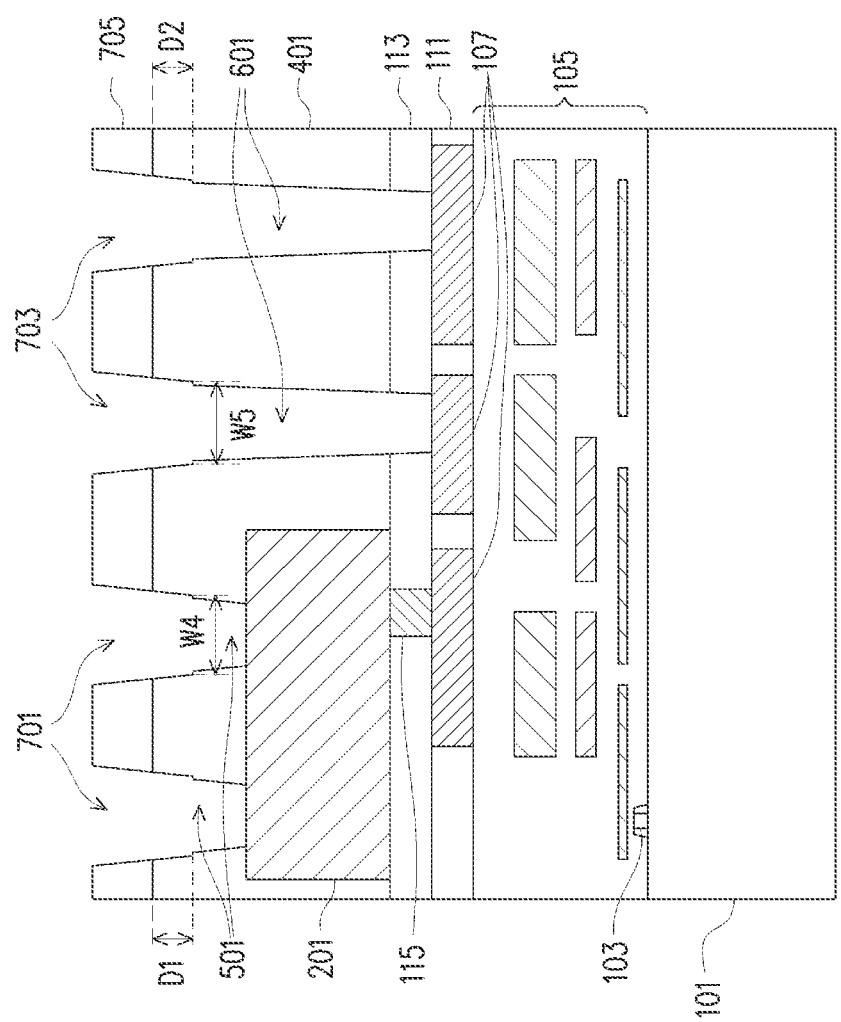

FIG. 7 illustrates an optional formation of third openings 701 and fourth openings 703 in the bond layer 401 to widen portions of the first openings 501 and the second openings 601, respectively. A third photoresist 705 is applied over top surfaces of the bond layer 401, test pad 201, and conductive features 107 and in the first openings 501 and the second openings 601. The third photoresist 705 is patterned and is then used to etch the bond layer 401 to form the third openings 701 and fourth openings 703. The bond layer 401 may be etched by dry etching (e.g., RIE or NBE), wet etching, or the like. The third openings 701 may be formed above the first openings 501 and the test pad 201. The fourth openings 703 may be formed above the second openings 601 and the conductive features 107. The third openings 701 may have a width W4 and a depth D1. The width W4 may be between about 2.2 μm and about 4.5 μm, such as about 2.3 μm. The depth D1 may be between about 0.8 μm and about 3.4 μm, such as about 0.85 μm. The fourth openings 703 may have a width W5 and a depth D2. The width W5 may be between about 2.2 µm and about 4.5 µm, such as about 2.3 µm. The depth D2 may be between about 0.8 µm and about 3.4 µm, such as about 0.85 µm. According to various embodiments, the width W4 may be the same or different than the width W5 and the depth D1 may be the same or different than the depth D2. A ratio of the width W4 to the width W5 may be between about 0.5 and about 1.8, such as about 1. A ratio of the depth D1 to the depth D2 may be between about 0.8 and about 1.2, such as about 1.

Figure 8:
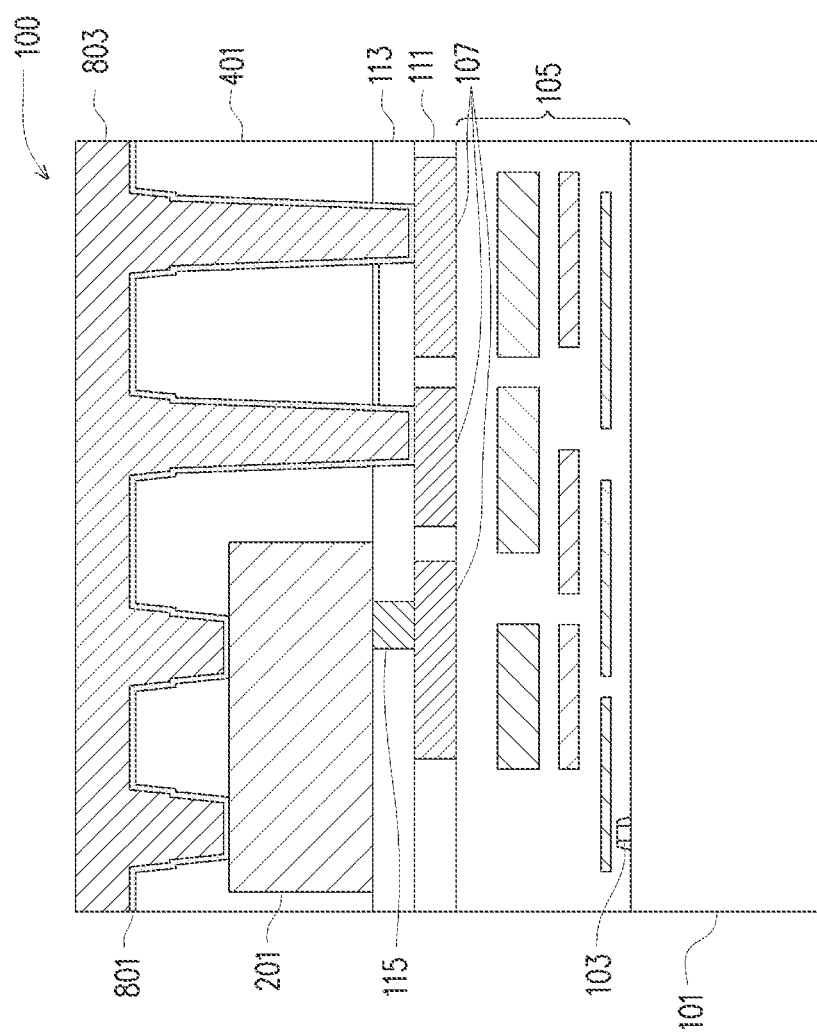

FIG. 8 illustrates the filling of the first openings 501, the second openings 601, the third openings 701, and the fourth openings 703 with a seed layer 801 and a plate metal 803. The seed layer 801 may be blanket deposited over top surfaces of the bond layer 401, the test pad 201, and the conductive features 107 and sidewalls of the first openings 501, the second openings 601, the third openings 701, and the fourth openings 703. The seed layer 801 may comprise a copper layer. The seed layer 801 may be deposited using processes such as sputtering, evaporation, or plasma-enhanced chemical vapor deposition (PECVD), or the like, depending upon the desired materials. The plate metal 803 may be deposited over the seed layer 801 through a plating process such as electrical or electro-less plating. The plate metal 803 may comprise copper, a copper alloy, or the like. The plate metal 803 may be a fill material. A barrier layer (not separately illustrated) may be blanket deposited over top surfaces of the bond layer 401, the test pad 201, and the conductive features 107 and sidewalls of the first openings 501, the second openings 601, the third openings 701, and the fourth openings 703 before the seed layer 801. The barrier layer may comprise titanium, titanium nitride, tantalum, tantalum nitride, or the like.

Figure 9:
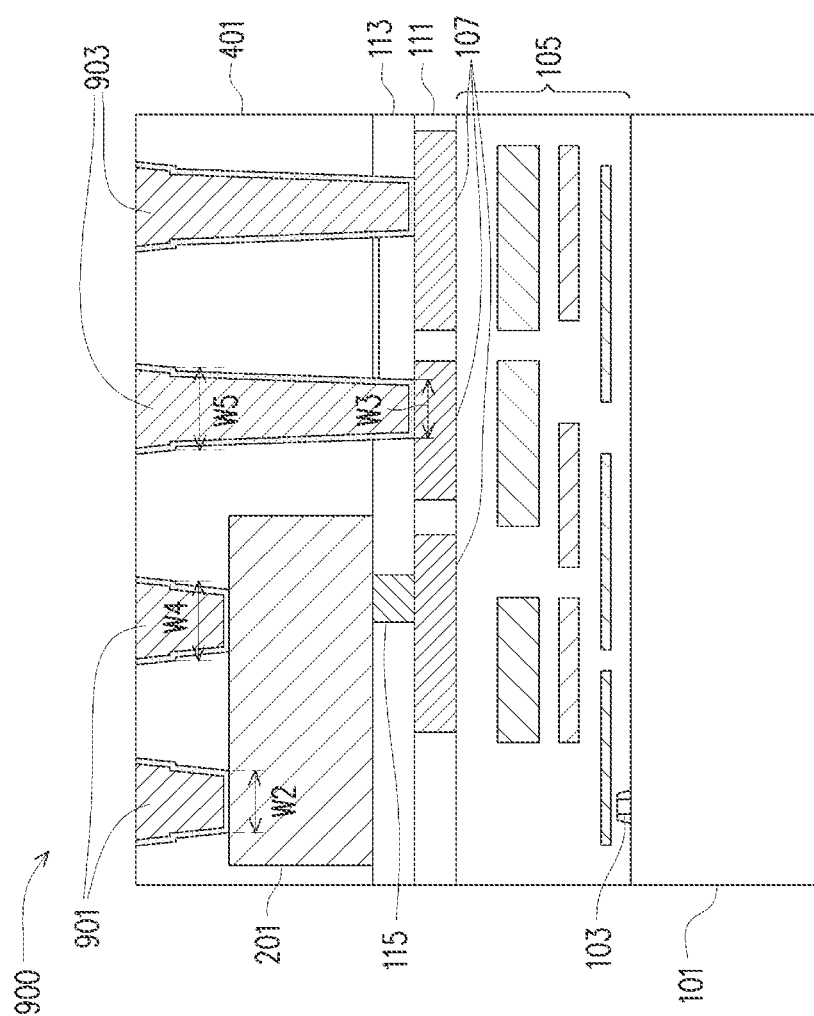

FIG. 9 illustrates a die 900 which includes first bond pads 901 and second bond pads 903. Following the filling of the first openings 501, the second openings 601, the third openings 701, and the fourth openings 703, shown in FIG. 8, a planarization process, such as a CMP, is performed to remove excess portions of the conductive material of the seed layer 801 and the plate metal 803, forming the first bond pads 901 and the second bond pads 903. The first bond pads 901 may contact the test pad 201 and the second bond pads 903 may contact the conductive features 107. According to at least one embodiment, the top surfaces of the first bond pads 901 and the second bond pads 903 are coplanar with each other and with the top surfaces of the bond layer 401. The top portions of the first bond pads 901 fill the third openings 701, have the width W4, and may be referred to as bond pad metals. The top portions of the second bond pads 903 fill the fourth openings 703, have the width W5, and may also be referred to as bond pad metals. The lower portions of the first bond pads 901 fill the first openings 501, have the width W2, and may be referred to as bond pad vias. The lower portions of the second bond pads 903 fill the second openings 601, have the width W3, and may also be referred to as bond pad vias.

Figure 10:
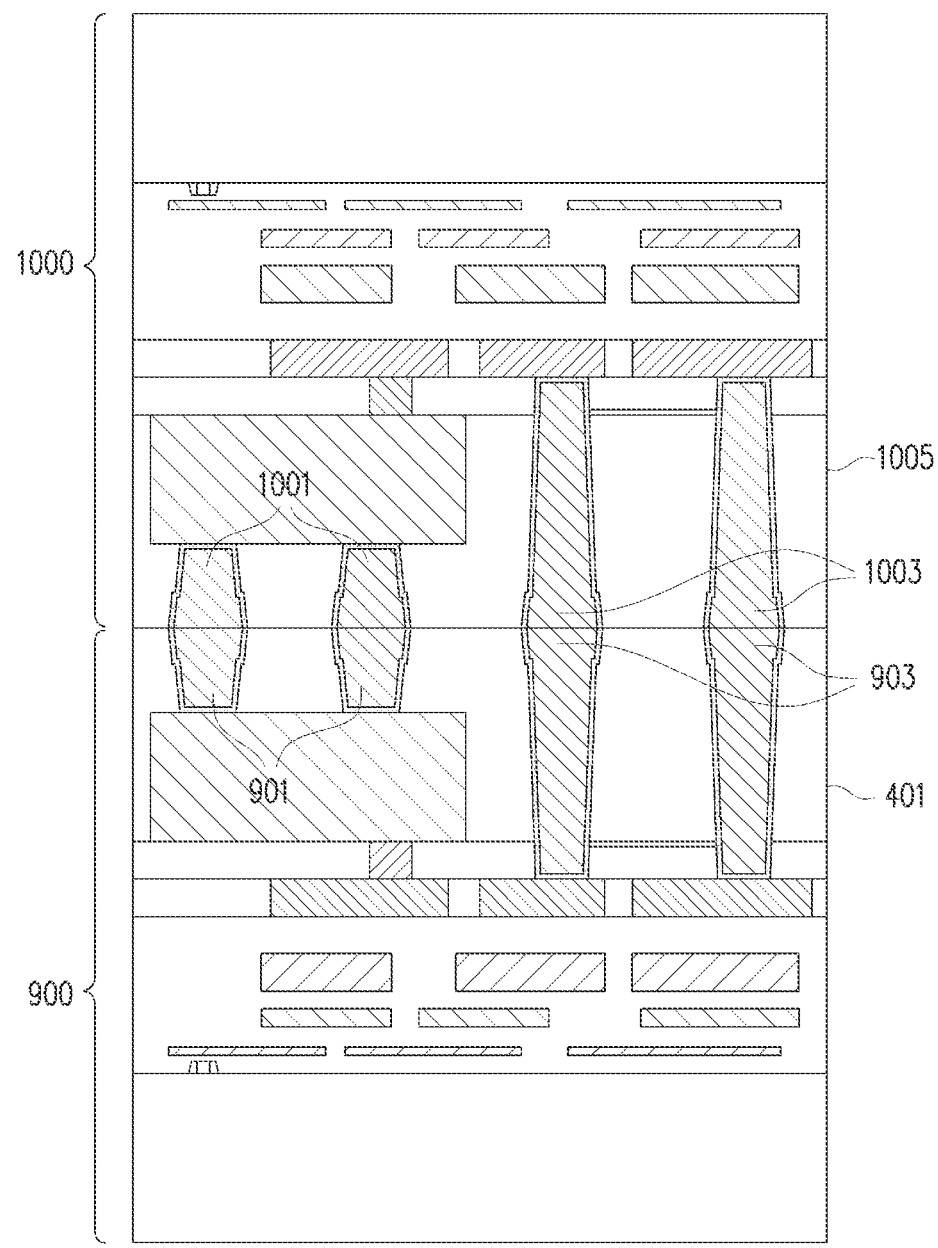

FIG. 10 illustrates a cross-sectional view of a processing step for bonding the die 900 to a package component 1000. In accordance with some embodiments of the present disclosure, the package component 1000 is a device die, an interposer die, a package substrate, or a package. According to an embodiment, the package component 1000 may be a device die which is the mirror image of the die 900. The package component 1000 includes first bond pads 1001, second bond pads 1003, and a dielectric layer 1005. The first bond pads 1001 may be similar to the first bond pads 901, the second bond pads 1003 may be similar to the second bond pads 903, and the dielectric layer 1005 may be similar to the bond layer 401. For example, the top surface of the dielectric layer 1005 is coplanar with the top surfaces of the first bond pads 1001 and the second bond pads 1003. The first bond pads 1001 and the second bond pads 1003 may comprise a conductive material such as copper, copper alloy, or the like. The dielectric layer 1005 may comprise a silicon-containing dielectric layer such as a silicon oxide layer, a silicon nitride layer, or the like.

In some embodiments, the die 900 is bonded to the package component 1000 by, for example, hybrid bonding. After the top surfaces of the die 900 and the package component 1000 are planarized, the top surfaces of the die 900 and the package component 1000 may be activated. Activating the top surfaces of die 900 and the package component 1000 may comprise a dry treatment, a wet treatment, a plasma treatment, exposure to an inert gas, exposure to $H_2$, exposure to $N_2$, exposure to $O_2$, or combinations thereof, as examples. In embodiments where a wet treatment is used, an RCA cleaning may be used, for example. In another embodiment, the activation process may comprise other types of treatments. The activation process assists in the hybrid bonding of the die 900 and the package component 1000; advantageously allowing the use of lower pressures and temperatures in subsequent hybrid bonding processes.

After the activation process, the die 900 and the package component 1000 may be cleaned using a chemical rinse. The wafer assembly is then subjected to thermal treatment and contact pressure to hybrid bond the die 900 to the package component 1000. The die 900 and the package component 1000 may be subjected to a pressure of about 200 kPa or less, and a temperature between about 200° C. and about 400° C. to fuse the bond layer 401 and the dielectric layer 1005. The die 900 and the package component 1000 may then be subjected to a temperature at or above the eutectic point for material of the first bond pad 901, the second bond pad 903, the first bond pad 1001, and the second bond pad 1003, e.g., between about 150° C. and about 650° C., to fuse the metal bond pads. In this manner, fusion of the die 900 and the package component 1000 forms a hybrid bonded device. In some embodiments, the bonded dies are baked, annealed, pressed, or otherwise treated to strengthen or finalize the bond.

In other embodiments, the die 900 may be bonded to the package component 1000 by direct surface bonding, metal-to-metal bonding, or another bonding process. A direct surface bonding process creates an oxide-to-oxide bond or substrate-to-substrate bond through a cleaning and/or surface activation process followed by applying pressure, heat and/or other bonding process steps to the joined surfaces. In some embodiments, the die 900 and the package component 1000 are bonded by metal-to-metal bonding that is achieved by fusing conductive elements. For example, the bond pads 1001 and 1003 are bonded to the bond pads 901 and 903, respectively, through metal-to-metal bonding.

The formation of the first bond pads 901 which contact the test pad 201 may increase the number of connections that can be made to the active devices 103 in the dies 900. Moreover, the first bond pads 901 which contact the test pad 201 may increase the pin out area over devices which do not include the first bond pads 901. For example, the pin out area of the dies 900 may be between about 3,000 pins and about 700 pins greater than the pin out area for a conventional die, such as about 30 percent greater.

Figure 11:
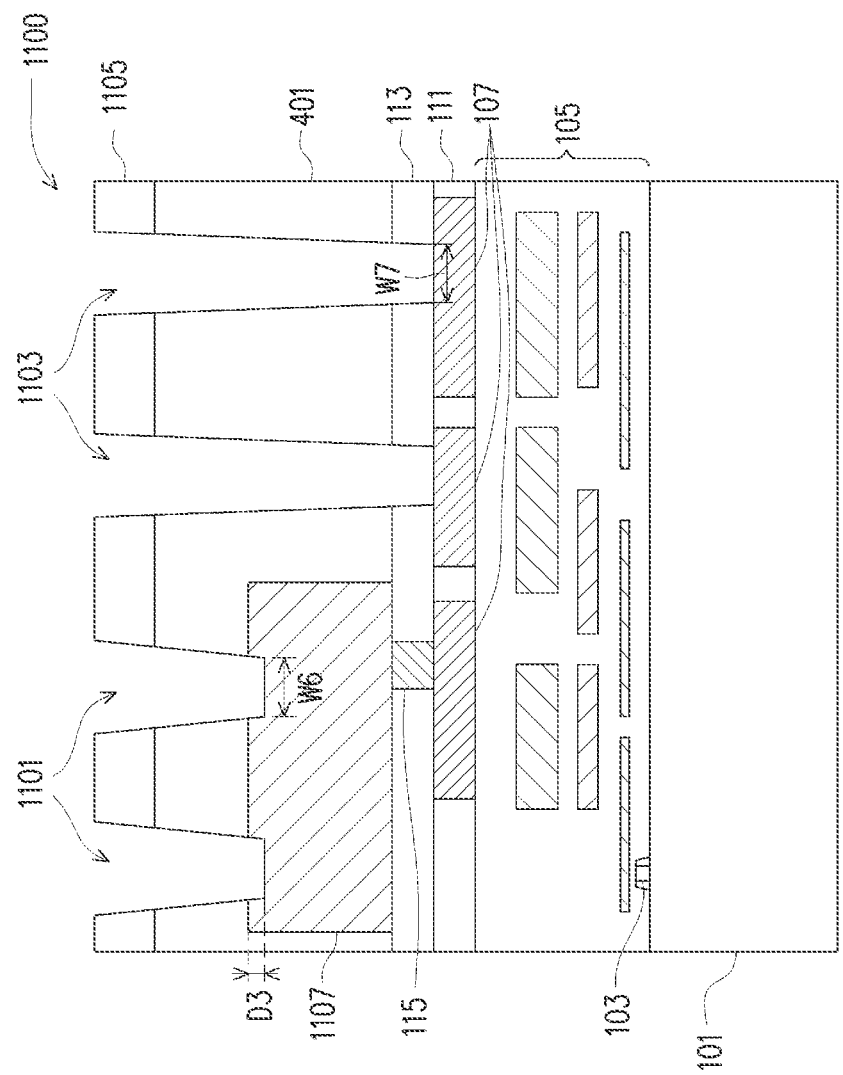
FIGS. 11-14 illustrate cross-sectional views of intermediate processing steps in forming a semiconductor die according to another embodiment.

FIG. 11 illustrates the formation of first openings 1101 and second openings 1103 in the bond layer 401 and the formation of a recessed test pad 1107 in accordance with another embodiment. Prior to forming the first openings 1101 and the second openings 1103 in the bond layer 401, a semiconductor die 1100 may be the same as or similar to the semiconductor die 100 illustrated in FIG. 4. A first photoresist 1105 is applied over the top surface of the bond layer 401 and patterned. The first photoresist 1105 is then used to etch the bond layer 401 in order to simultaneously form the first openings 1101 and the second openings 1103. The bond layer 401 may be etched by dry etching (e.g., RIE or NBE), wet etching, or the like. The bond layer 401 may be etched by a single etch or by multiple etches. Moreover, if multiple etches are used to etch the bond layer 401, each of the etches may use the same or a different etching process.

In accordance with some embodiments of the present disclosure, the etching stops when the second openings 1103 reach the conductive features 107 such that the conductive features 107 are exposed through the second openings 1103 in the bond layer 401. Because the first openings 1101 are etched at the same time as the second openings 1103, the etching may expose the test pad 201 and etch a depth D3 into the test pad 201 such that the recessed test pad 1107 is formed. The depth D3 may be between about 1,000 Å and about 2,500 Å, such as about 2,000 Å. The openings 1101 may have a width W6 of between about 1.2 µm and about 2 µm, such as about 1.4 µm and the openings 1103 may have a width W7 of between about 1.2 µm and about 2 µm, such as about 1.4 µm. According to various embodiments, the width W6 may be the same or different than the width W7. A ratio of the width W6 to the width W7 may be between about 0.8 and about 1.2, such as about 1.

Figure 12:
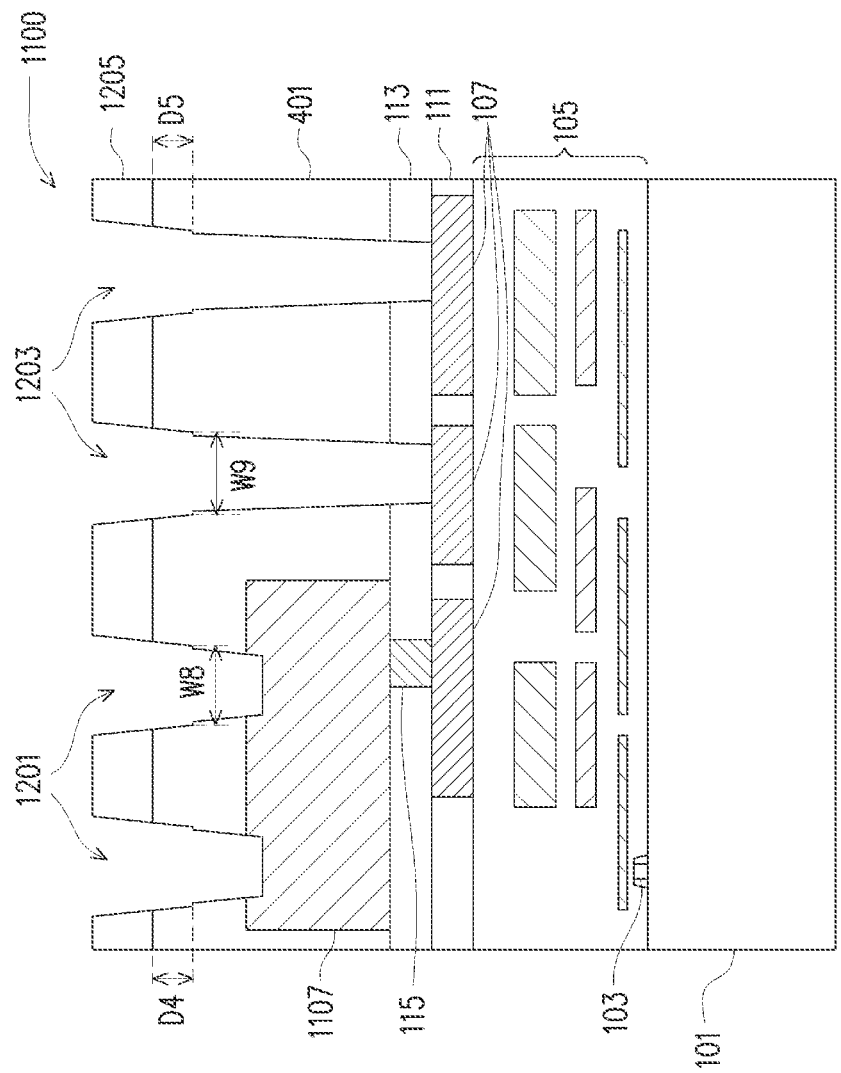

FIG. 12 illustrates the formation of third openings 1201 and fourth openings 1203 in the bond layer 401 to widen portions of the first openings 1101 and the second openings 1103, respectively. A second photoresist 1205 is applied over top surfaces of the bond layer 401, the test pad 1107, and the conductive features 107 and in the first openings 1101 and the second openings 1103. The second photoresist 1205 is patterned and is then used to etch the bond layer 401 to form the third openings 1201 and the fourth openings 1203. The third openings 1201 may be formed above the first openings 1101 and the test pad 1107. The fourth openings 1203 may be formed above the second openings 1103 and the conductive features 107. The third openings 1201 may have a width W8 and a depth D4. The width W8 may be between about 2.2 µm and about 4.5 µm, such as about 2.3 µm. The depth D4 may be between about 0.8 µm and about 3.4 µm, such as about 0.85 µm. The fourth openings 1203 may have a width W9 and a depth D5. The width W9 may be between about 2.2 µm and about 4.5 µm, such as about 2.3 µm. The depth D5 may be between about 0.8 µm and about 3.4 µm, such as about 0.85 µm. According to various embodiments, the width W8 may be the same or different than the width W9. A ratio of the width W8 to the width W9 may be between about 0.5 and about 1.5, such as about 1. The widths W7 and W8 of the third openings 1201 and the fourth openings 1203 are greater than the widths W5 and W6 of the first openings 1101 and the second openings 1103, respectively. More specifically, a ratio of the width W8 of the third openings 1201 to the width W6 of the first openings 1101 is between about 1.1 and about 4, such as about 1.6 and a ratio of the width W9 of the openings fourth 1203 to the width W7 of the second openings 1103 is between about 1.1 and about 4, such as about 1.6.

Figure 13:
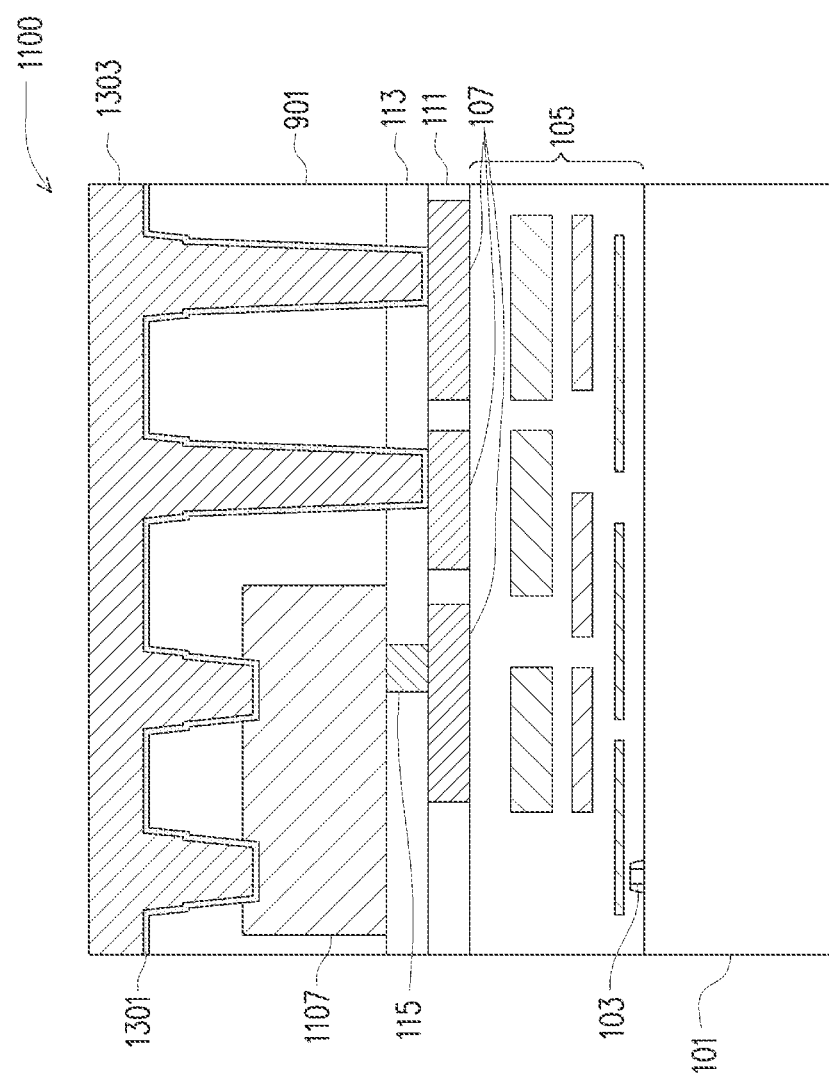

FIG. 13 illustrates the filling of the first openings 1101, the second openings 1103, the third openings 1201, and the fourth openings 1203 with a seed layer 1301 and a plate metal 1303. The seed layer 1301 may be blanket deposited over top surfaces of the bond layer 401, the test pad 201, and the conductive features 107 and sidewalls of the first openings 1101, the second openings 1103, the third openings 1201, and the fourth openings 1203. The seed layer 1301 may comprise a copper layer. The plate metal 1303 may be deposited over the seed layer 1301 through a plating process such as electrical or electro-less plating. The plate metal 1303 may comprise copper, a copper alloy, or the like. A barrier layer (not separately illustrated) may also be blanket deposited over top surfaces of the bond layer 401, recessed portions of the recessed test pad 1107, and the conductive features 107 and sidewalls of the first openings 1101, the second openings 1103, the third openings 1201, and the fourth openings 1203 before the seed layer 1301. The barrier layer may comprise titanium, titanium nitride, tantalum, tantalum nitride, or the like.

Figure 14:
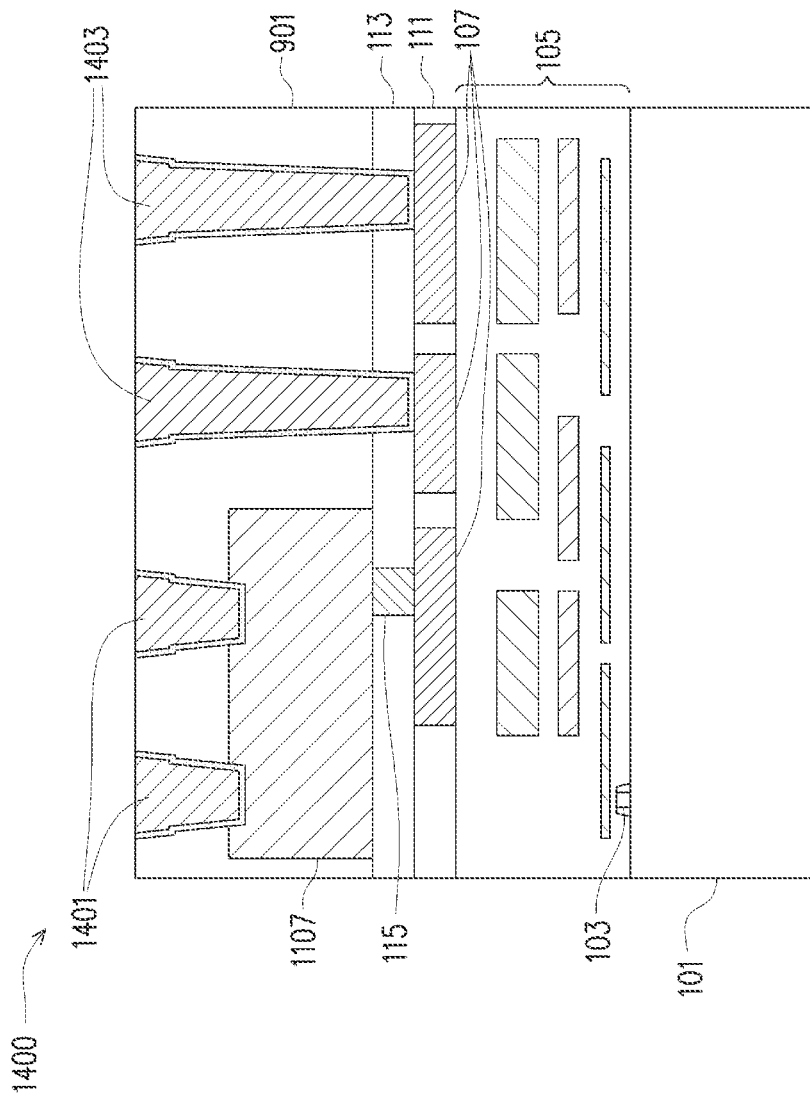

FIG. 14 illustrates a die 1400 which includes first bond pads 1401 and second bond pads 1403. Following the filling of the first openings 1101, the second openings 1103, the third openings 1201, and the fourth openings 1203 shown in FIG. 13, a planarization process, such as a CMP, is performed to remove excess portions of the conductive material of the seed layer 1301 and the plate metal 1303, forming the first bond pads 1401 and the second bond pads 1403. The first bond pads 1401 may contact the recessed test pad 1107 and the second bond pads 1403 may contact the conductive features 107. According to at least one embodiment, the top surfaces of the first bond pads 1401 and the second bond pads 1403 are coplanar with each other and with the top surfaces of the bond layer 401. The top portions of the first bond pads 1401 fill the third openings 1201, have the width W8, and may be referred to as bond pad metals. The top portions of the second bond pads 1403 fill the fourth openings 1203, have the width W9, and may also be referred to as bond pad metals. The lower portions of the first bond pads 1401 fill the first openings 1101, have the width W6, and may be referred to as bond pad vias. The lower portions of the second bond pads 1403 fill the second openings 1103, have the width W7, and may also be referred to as bond pad vias.

The formation of the first bond pads 1401 which contact the recessed test pad 1107 may increase the number of connections that can be made to the active devices 103 in the dies 1400. Moreover, the first bond pads 1401 which contact recessed test pad 1107 may increase the pin out area over devices which do not include the first bond pads 1401. For example, the pin out area of the dies 1400 may be between about 3,000 pins and about 700 pins greater than the pin out area for a conventional die, such as about 30 percent greater. In addition, the second embodiment, which includes the recessed test pad 1107, may reduce the number of steps required to form the die 1400 and may result in cost savings. The second embodiment may result in increased surface area of contact between the first bond pads 1401 and the recessed test pad 1107.

In accordance with an embodiment, a method includes forming a first conductive feature and a second conductive feature over a substrate; forming a test pad over and electrically connected to the first conductive feature; forming a bond layer over the test pad and the second conductive feature; etching the bond layer to form a first opening extending to the test pad; etching the bond layer to form a second opening extending to the second conductive feature; and forming a first bond pad and a second bond pad in the first opening and the second opening, respectively, the first bond pad being electrically coupled to the test pad and the second bond pad being electrically coupled to the second conductive feature. In an embodiment, the method further includes forming a passivation layer over the first conductive feature and the second conductive feature; etching the passivation layer to form a third opening exposing the first conductive feature; and forming a via in the third opening, the forming the test pad electrically connecting the test pad to the first conductive feature through the via. In an embodiment, etching the bond layer to form the second opening further includes etching the passivation layer to expose the second conductive feature, the forming the second bond pad forming the second bond pad to extend through the bond layer and the passivation layer. In an embodiment, the first conductive feature and the second conductive feature include a first conductive material, and the test pad includes a second conductive material different from the first conductive material. In an embodiment, the first conductive material is copper and the second conductive material is aluminum. In an embodiment, the method further includes forming a dielectric layer, the dielectric layer electrically isolating the first conductive feature from the second conductive feature. In an embodiment, the method further includes etching the bond layer to form a third opening, the third opening being disposed above at least one of the first opening and the second opening and the third opening having a width greater than a width of the first opening or a width of the second opening. In an embodiment, the bond layer is etched to form the second opening after the bond layer is etched to form the first opening.

In accordance with another embodiment, a method includes forming a first conductive feature and a second conductive feature over an interconnect structure, the interconnect structure being over a substrate; forming a test pad over and electrically connected to the first conductive feature; probing the test pad to determine an electrical connectivity between the test pad and the interconnect structure; forming a dielectric layer over the test pad and the second conductive feature; forming a first bond pad through the dielectric layer, the first bond pad contacting the test pad; and forming a second bond pad through the dielectric layer, the second bond pad contacting the second conductive feature, and the second bond pad having a larger height than the first bond pad. In an embodiment, the first bond pad and the second bond pad are formed simultaneously. In an embodiment, a bottommost surface of the first bond pad is disposed a distance below a topmost surface of the test pad. In an embodiment, the distance is between about 1,000 Å and about 2,500 Å. In an embodiment, the method further includes simultaneously etching the dielectric layer to form a first opening extending to the test pad and a second opening extending to the second conductive feature, the first bond pad being formed in the first opening and the second bond pad being formed in the second opening. In an embodiment, a ratio of a width of the first bond pad to a width of the second bond pad is between about 0.5 and about 1.8.

In accordance with yet another embodiment, an integrated circuit includes a first metal feature and a second metal feature disposed in a single top metal layer over a substrate; a test pad over and electrically connected to the first metal feature; a first passivation layer over the second metal feature and the test pad and covering a top surface and side surfaces of the test pad; a first via penetrating through the first passivation layer to contact the test pad; and a second via penetrating through the first passivation layer to contact the second metal feature. In an embodiment, the integrated circuit further includes a second passivation layer disposed between the first passivation layer and the single top metal layer, the second passivation layer separating the test pad from the first metal feature; and a third via extending through the second passivation layer, the third via electrically connecting the test pad to the first metal feature. In an embodiment, the top surface of the test pad includes a recess, and at least a portion of the first via is disposed in the recess. In an embodiment, the first metal feature and the second metal feature include a first conductive material and the test pad includes a second conductive material different from the first conductive material. In an embodiment, the first conductive material is copper and the second conductive material is aluminum. In an embodiment, a height of the second via is greater than a combined height of the first via and the test pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first conductive feature and a second conductive feature over a semiconductor substrate, wherein a top surface of the first conductive feature is level with a top surface of the second conductive feature;
   a test pad over and electrically connected to the first conductive feature;
   a bond layer over the test pad and the second conductive feature;
   a first bond pad extending through the bond layer and electrically connected to the test pad; and
   a second bond pad extending through the bond layer and electrically connected to the second conductive feature, wherein a top surface of the second bond pad is level with a top surface of the first bond pad, and wherein a bottom surface of the second bond pad is closer to the semiconductor substrate than a bottom surface of the first bond pad.

2. The semiconductor device of claim 1, further comprising a passivation layer between the bond layer and both the first conductive feature and the second conductive feature, wherein the second bond pad extends through the passivation layer.

3. The semiconductor device of claim 2, further comprising a via extending through the passivation layer and electrically connecting the test pad to the first conductive feature.

4. The semiconductor device of claim 1, wherein the first conductive feature and the second conductive feature comprise a first conductive material, and wherein the test pad comprises a second conductive material different from the first conductive material.

5. The semiconductor device of claim 4, wherein the first conductive material is copper and the second conductive material is aluminum.

6. The semiconductor device of claim 1, further comprising a dielectric layer surrounding sidewalls of the first conductive feature and the second conductive feature, wherein the dielectric layer electrically isolates the first conductive feature from the second conductive feature.

7. The semiconductor device of claim 1, wherein the first bond pad and the second bond pad have stepped sidewalls.

8. The semiconductor device of claim 7, wherein a bottom portion of the first bond pad has a width from 1.2 µm to 2 µm, wherein a top portion of the first bond pad has a width from 2.2 µm to 4.5 µm, wherein a bottom portion of the second bond pad has a width from 1.2 µm to 2 µm, and wherein a top portion of the second bond pad has a width from 2.2 µm to 4.5 µm.

9. A semiconductor device comprising:
   a first conductive feature and a second conductive feature over a semiconductor substrate;
   a dielectric layer surrounding sidewalls of the first conductive feature and the second conductive feature;
   a test pad over and electrically connected to the first conductive feature;
   a bond layer over the test pad and the second conductive feature;
   a first bond pad electrically connected to the test pad; and
   a second bond pad electrically connected to the second conductive feature, wherein a height of the second bond pad is greater than a combined height of the test pad and the first bond pad.

10. The semiconductor device of claim 9, further comprising a passivation layer over the dielectric layer, the first conductive feature, and the second conductive feature, wherein the test pad and the bond layer are over the passivation layer.

11. The semiconductor device of claim 10, further comprising a via in the passivation layer, the via electrically connecting the test pad to the first conductive feature.

12. The semiconductor device of claim 10, wherein a height of the second bond pad is equal to a combined height of the passivation layer and the bond layer.

13. The semiconductor device of claim 9, the first bond pad extends below a top surface of the test pad.

14. The semiconductor device of claim 9, wherein the first conductive feature and the second conductive feature comprise a first conductive material and the test pad comprises a second conductive material different from the first conductive material.

15. An integrated circuit comprising:
    a first metal feature and a second metal feature disposed in a single top metal layer over a substrate;
    a test pad over and electrically connected to the first metal feature;
    a first passivation layer over the second metal feature and the test pad and covering a top surface and side surfaces of the test pad;
    a first conductive via penetrating through the first passivation layer to contact the test pad; and
    a second conductive via penetrating through the first passivation layer to contact the second metal feature, wherein the second conductive via has a height larger than a height of the first conductive via.

16. The integrated circuit of claim 15, further comprising:
    a second passivation layer disposed between the first passivation layer and the single top metal layer, the second passivation layer separating the test pad from the first metal feature; and
    a third conductive via extending through the second passivation layer, the third conductive via electrically connecting the test pad to the first metal feature.

17. The integrated circuit of claim 15, wherein the top surface of the test pad includes a recess, and wherein at least a portion of the first conductive via is disposed in the recess.

18. The integrated circuit of claim 15, wherein the first metal feature and the second metal feature comprise a first conductive material and the test pad comprises a second conductive material different from the first conductive material.

19. The integrated circuit of claim 18, wherein the first conductive material is copper and the second conductive material is aluminum.

20. The integrated circuit of claim 15, wherein a height of the second conductive via is greater than a combined height of the first conductive via and the test pad.

* * * * *